(12) United States Patent
Saeki

(10) Patent No.: US 6,483,745 B2
(45) Date of Patent: Nov. 19, 2002

(54) NON-VOLATILE SEMICONDUCTOR MEMORY DEVICE WITH DEFECT DETECTION

(75) Inventor: Takahiro Saeki, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/938,139

(22) Filed: Aug. 23, 2001

(65) Prior Publication Data

US 2002/0024844 A1 Feb. 28, 2002

(30) Foreign Application Priority Data

Aug. 23, 2000 (JP) ........................................ 2000-253194

(51) Int. Cl.⁷ ............................................. G11C 16/04
(52) U.S. Cl. ............................ 365/185.04; 365/185.29; 365/210
(58) Field of Search ........................ 365/185.04, 185.24, 365/185.29, 185.33, 185.2, 218, 189.07, 210

(56) References Cited

U.S. PATENT DOCUMENTS 4,901,320 A * 2/1990 Sawada et al. ............. 371/51.1
5,652,720 A * 7/1997 Aulas et al. ............ 365/185.09
6,049,899 A * 4/2000 Auclair et al. .............. 714/721

FOREIGN PATENT DOCUMENTS

JP          08-190796        7/1996

* cited by examiner

Primary Examiner—David Nelms
Assistant Examiner—Thong Le
(74) Attorney, Agent, or Firm—Morrison & Foerster LLP

(57) ABSTRACT

A non-volatile semiconductor memory device for allowing a data writing operation to, a data reading operation from, and a data erasing operation from a plurality of non-volatile memory cells. The non-volatile semiconductor memory device includes a data comparison section for outputting a first comparison result obtained by comparing data read from each of the plurality of memory cells and data read using a reference element for reading, a second comparison result obtained by comparing data read from each of the plurality of memory cells and data read from a reference element for writing, and a third comparison result obtained by comparing data read from each of the plurality of memory cells and data read from a reference element for erasing; and a data storage defect detection section for detecting a data storage defect of a memory cell among the plurality of memory cell, based on the first, second and third comparison results obtained from the data comparison section.

18 Claims, 8 Drawing Sheets

NON-VOLATILE SEMICONDUCTOR MEMORY DEVICE WITH DEFECT DETECTION

CROSS-REFERENCE TO RELATED APPLICATIONS

This application claims priority to Japanese Patent Application No. 2000-253194 filed Aug. 23, 2000, the content of which is incorporated herein by reference in its entirety.

BACKGROUND OF THE INVENTION

1. Field of the Invention

The present invention relates to a non-volatile semiconductor memory device such as, for example, an EEPROM (Electrically Erasable and Programmable Read-Only Memory) device.

2. Description of the Related Art

Conventionally, an EEPROM type memory device accumulates charges in a floating gate of a floating gate-type MOS transistor (hereinafter, referred to simply as a "transistor") forming a memory cell, and stores data using a change in the threshold voltage value of the transistor which is caused by a change in the amount of the charges accumulated in the floating gate. However, in actual use, a phenomenon occurs that the charges accumulated in the floating gate escape via an insulating layer provided for insulating the floating gate from an electrode of the transistor. Such a phenomenon occurs because, for example, the insulating layer deteriorates over-time, and generates a data storage defect.

In order to prevent this phenomenon, the following techniques are used in general: (i) the insulating layer of the memory cell is reinforced during the production process of the EEPROM type memory device; and (ii) the voltage conditions for erasing and writing data are optimized so as to minimize a stress applied to the insulating layer when data is erased or written.

One example of the techniques (i) and (ii) is described in Japanese Laid-Open Publication No. 8-190796 entitled "Flash Memory Having Data Refreshing Function and Data Refreshing Method for Flash Memory".

The above-mentioned publication discloses a method of detecting a memory cell, among a plurality of memory cells, in which charges have escaped from the floating gate and then rewriting data to the detected memory cell. According to this method, a reference cell for erasing and a reference cell for writing are used. When a memory cell is determined to be at a writing level using the reference cell for erasing, and when a memory cell is determined to be at an erasing level using the reference cell for writing, the memory cell is determined to be the defective memory cell in which charges have escaped from the floating gate.

In general, the escape of charges from the floating gate occurs most often among the defects involving the floating gate of an EEPROM type memory device. Other defects include an excessive increase in charges accumulated in the floating gate in the memory cell. By the above-described conventional method for detecting a memory storage defect, a cell in which the charges have been increased cannot be clearly distinguished from a cell in which the charges have escaped, and thus an increase in the charges is determined to be an escape of charges. In this specification, the defect that charges escape from a floating gate of a memory cell will be referred to as a "charge escaping defect", and the defect that charges are excessively increased in a floating gate of a memory cell will be referred to as a "charge increasing defect". The charge escaping defect and the charge increasing defect are both data storage detects.

In the case where no measure is taken against the charge escaping defect or the charge increasing defect, the following inconvenience occurs. The data storage characteristic of the memory device has a prescribed level immediately after the memory device is produced, but the insulating layer of the floating gate of the device tends to deteriorate as the device is used, especially as more and more data is erased from or written to the device. The level of data storage characteristic of the memory device is gradually decreased. In order to provide a memory device which is reliable for an extended period of time with certainty, it is necessary to accumulate a vast amount of know-how or expertise in terms of both designing and production, which is very difficult to realize.

SUMMARY OF THE INVENTION

According to one aspect of the invention, a non-volatile semiconductor memory device for allowing a data writing operation to, a data reading operation from, and a data erasing operation from a plurality of non-volatile memory cells is provided. The non-volatile semiconductor memory device includes a data comparison section for outputting a first comparison result obtained by comparing data read from each of the plurality of memory cells and data read using a reference element for reading, a second comparison result obtained by comparing data read from each of the plurality of memory cells and data read from a reference element for writing, and a third comparison result obtained by comparing data read from each of the plurality of memory cells and data read from a reference element for erasing; and a data storage defect detection section for detecting a data storage defect of a memory cell among the plurality of memory cell, based on the first, second and third comparison results obtained from the data comparison section.

In one embodiment of the invention, the data comparison section includes a reference element group including the reference element for reading, the reference element for writing, and the reference element for erasing; and a sensing differential amplification section connected to each of the plurality of memory cells, which are of an EEPROM type, at one input end of the section and also connected to the reference element group at the other input end of the section.

In one embodiment of the invention, when a threshold voltage value of a memory cell among the plurality of memory cells is between a threshold voltage value of the reference element for reading and a threshold voltage value of the reference element for writing, the data storage defect detection section determines that the memory cell has a charge escaping defect.

In one embodiment of the invention, when a threshold voltage value of a memory cell among the plurality of memory cells is between a threshold voltage value of the reference element for reading and a threshold voltage value of the reference element for erasing, the data storage defect detection section determines that the memory cell has a charge increasing defect.

In one embodiment of the invention, the data storage detection section detects the data storage defect at least one of: during a non-selection period of each memory cell, during a blank period while normal data read is performed from each memory cell, and when power is turned on.

In one embodiment of the invention, when a threshold voltage value of a memory cell among the plurality of memory cells is between a threshold voltage value of the reference element for reading and a threshold voltage value of the reference element for writing, the data storage defect detection section determines that the memory cell has a charge escaping defect.

In one embodiment of the invention, when a threshold voltage value of a memory cell among the plurality of memory cells is between a threshold voltage value of the reference element for reading and a threshold voltage value of the reference element for erasing, the data storage defect detection section determines that the memory cell has a charge increasing defect.

In one embodiment of the invention, when a threshold voltage value of a memory cell among the plurality of memory cells is between a threshold voltage value of the reference element for reading and a threshold voltage value of the reference element for erasing, the data storage defect detection section determines that the memory cell has a charge increasing defect.

In one embodiment of the invention, the non-volatile semiconductor memory device further includes a record information storage section for storing, as record information, memory cell information corresponding to the charge escaping defect and memory cell information corresponding to the charge increasing defect.

In one embodiment of the invention, when a threshold voltage value of a memory cell among the plurality of memory cells is between a threshold voltage value of the reference element for reading and a threshold voltage value of the reference element for erasing, the data storage defect detection section determines that the memory cell has a charge increasing defect.

In one embodiment of the invention, the non-volatile semiconductor memory device further includes a record information storage section for storing, as record information, memory cell information corresponding to the charge escaping defect and memory cell information corresponding to the charge increasing defect.

In one embodiment of the invention, the non-volatile semiconductor memory device further includes a data rewriting section for, when a memory cell among the plurality of memory cells has the charge escaping defect, performing a data rewriting operation to the memory cell.

In one embodiment of the invention, the data rewriting section performs the data rewriting operation when the memory cell returns from a super low power consumption mode to a normal power consumption mode.

In one embodiment of the invention, the data rewriting section performs the data rewriting operation when the memory device goes into the super low power consumption mode.

In one embodiment of the invention, the data rewriting section performs the data rewriting operation by supplying power from a backup capacitance section when the memory device goes into the super low power consumption mode.

In one embodiment of the invention, the non-volatile semiconductor memory device further includes a supply voltage monitor section for outputting a writing stop signal for stopping the data rewriting operation when the power supplied from the backup capacitance section becomes a prescribed level or lower.

In one embodiment of the invention, the non-volatile semiconductor memory device further includes a final address storage section for storing a final address of a final memory cell, among the plurality of memory cells, from which the data reading operation was performed for detecting the data storage defect. The data storage defect detection section uses the address stored in the final address storage section to resume detection of the data storage defect by performing the data reading operation using the final address.

According to another aspect of the invention, an information apparatus uses the above-described non-volatile semiconductor memory device for detecting a data storage defect of a memory cell.

As described above, according to the present invention, a data storage defect is detected based on a comparison result between the data read from a memory cell and data read from each of a reference element for reading, a reference element for writing and a reference element for erasing. Therefore, a charge escaping defect and a charge increasing defect can be clearly distinguished from each other. Thus, highly reliable data storage can be realized without entirely requiring a vast amount of know-how to be accumulated.

According to the present invention, a data comparison section can be easily and satisfactorily formed using a reference element group and a sensing differential amplification section.

According to the present invention, a memory cell having an abnormal or defective data storage characteristic is detected using a reference element for reading and a reference element for writing. Therefore, a charge escaping defect can be detected with high precision.

According to the present invention, a memory cell having an abnormal or defective data storage characteristic is detected using a reference element for reading and a reference element for erasing. Therefore, a charge increasing defect can be detected with high precision.

According to the present invention, whether the data storage is normally performed or not can be checked when the memory device is turned on. Usually when the memory device is turned on, a memory system including the memory device is provided with a delay period for stable start. This delay time period can be used to perform a background data rewriting operation. Thus, a difficult-to-obtain time period for the background rewriting operation can be obtained with certainty. A data storage defect can also be detected during a non-selection period of the memory device and a blank period while normal data read is performed from the memory cell.

According to the present invention, when a memory cell has a charge escaping defect, the data can be rewritten to the memory cell to compensate for the defect.

When the memory system returns from a super low power consumption mode to a normal power consumption mode, the memory system is usually provided with a delay period for stable return. According to the present invention, this delay period is used to perform a background data rewriting operation. Thus, a difficult-to-obtain time period for the background rewriting operation can be obtained with certainty.

When the memory system goes into the super low power consumption mode, the memory system is usually provided with a delay period for stable return. According to the present invention, this delay period is used to perform a background data rewriting operation. Thus, a difficult-to-obtain time period for the background rewriting operation can be obtained with certainty.

According to the present invention, the memory device has a built-in backup capacitance section such as a capacitor for obtaining energy required to perform a background operation in the super low power consumption mode. Therefore, the stable background operation is obtained, and the time period in which the stable background can be performed can be extended.

According to the present invention, when the supply voltage lowers to a prescribed value or lower, the data rewriting operation is stopped. Thus, the data rewriting operation can be performed more stably.

According to the present invention, information regarding a memory having a charge escaping defect or a charge increasing defect is stored as record information. A record information storage section can be formed using a dedicated memory which allows data to be written only once. By removing the information from the record information storage section later, information (e.g., parameters) which is important for development of a device having still higher reliability can be obtained.

According to the present invention, when a background reading operation for detecting a charge escaping defect or a charge increasing defect is interrupted, address information of the final memory cell which was scanned is stored in, for example, a work RAM area. When the background operation is allowed to be performed again, the address of the memory cell at which the background operation is to be started is determined based on the information. Thus, an efficient background reading operation can be performed. When power is turned off while a background reading operation for detecting a charge escaping defect or a charge increasing defect is performed, address scanning information is stored in, for example, an EEPROM area. When the power is turned on again and the background reading operation is resumed, the address scanning information up to the previous background reading operation can be read from the EEPROM area and the reading operation is started using the address at which the previous background reading operation was terminated. Thus, an efficient background reading operation can be performed.

Thus, the invention described herein makes possible the advantages of providing a non-volatile semiconductor memory device for clearly distinguishing a charge escaping defect from a charge increasing defect so as to realize highly reliable data storage relatively easily without entirely requiring a vast amount of know-how to be accumulated.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings. In the following description, a non-volatile semiconductor memory device according to the present invention is applied to an EEPROM type memory device.

Figure 1:
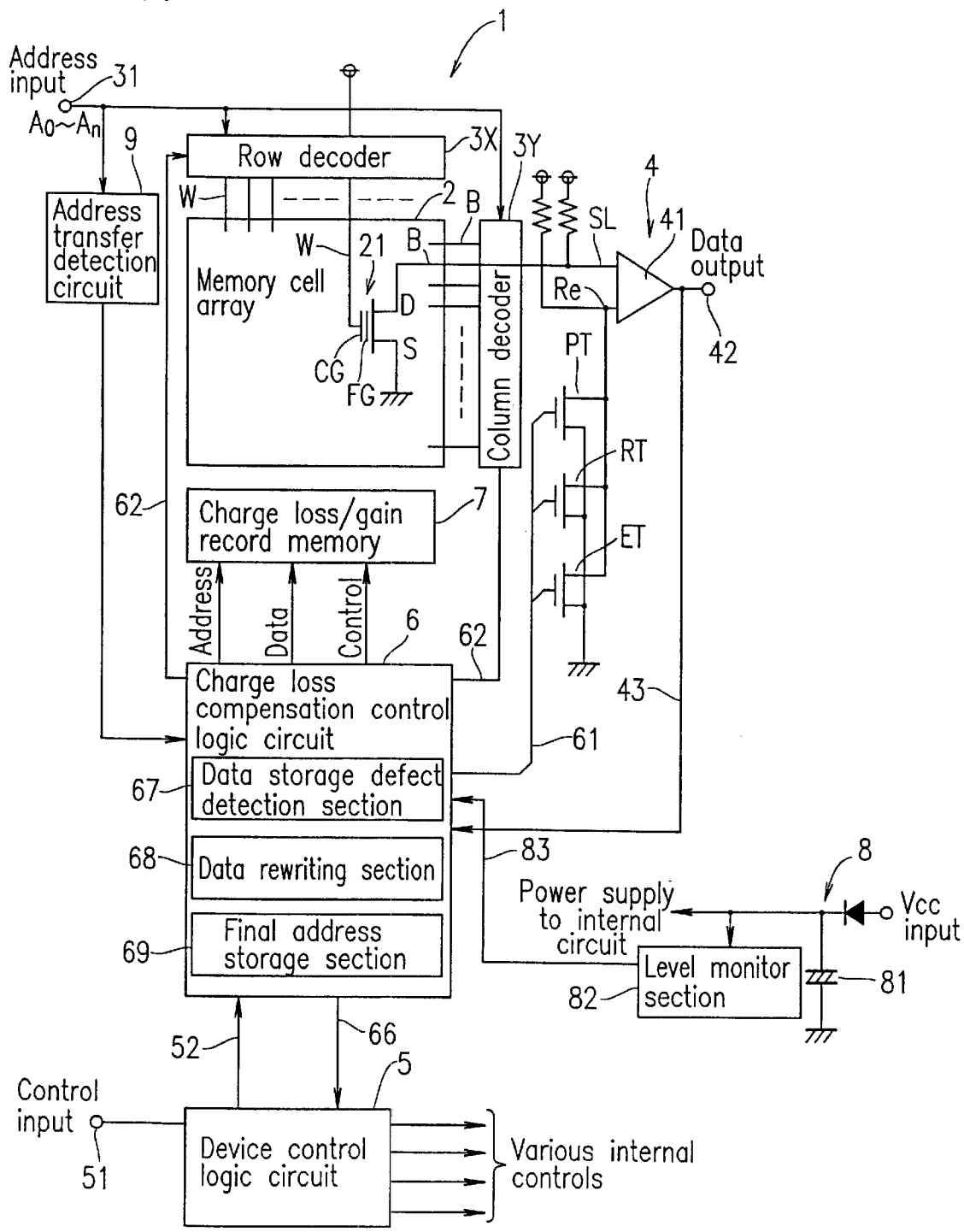
FIG. 1 is a block diagram illustrating a structure of an EEPROM type memory device according to one example of the present invention.

FIG. 1 is a block diagram illustrating a structure of an EEPROM type memory device 1 according to one example of the present invention. FIG. 1 shows only elements relating to the present invention and omits the other elements for the sake of simplicity. For example, an EEPROM type memory device requires circuits involved in normal data write and erase (e.g., a switched capacitor circuit and the like), but these circuits and the like are not shown in FIG. 1. Here, detection of a charge escaping detect and a charge increasing defect, and compensation for the charge escaping detect will be mainly described.

As shown in FIG. 1, the EEPROM type memory device 1 (hereinafter, referred to simply as the "memory device 1") includes a memory cell array 2, a row decoder 3X, a column decoder 3Y, a data comparison section 4, a device control logic circuit 5, a charge loss compensation control logic circuit 6, a charge loss/gain record memory 7, a level monitor section 8 as a supply voltage monitor section, and an address transfer detection circuit 9.

Figure 2:
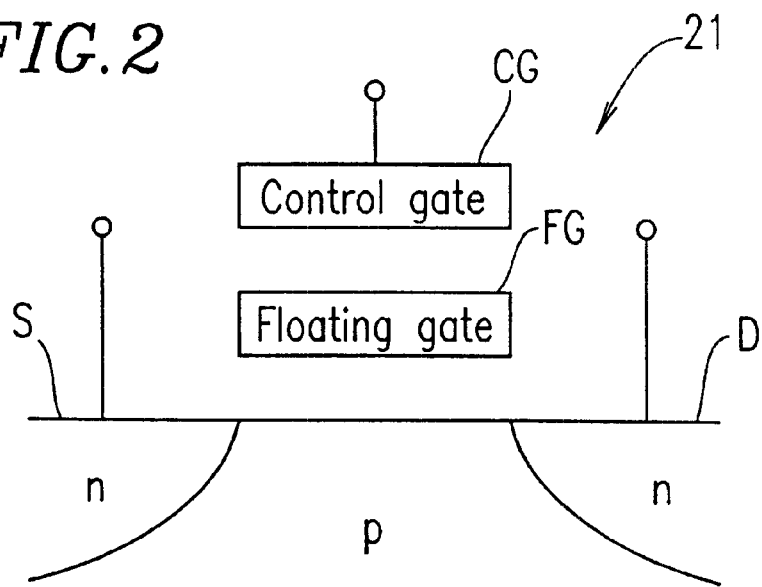
FIG. 2 is a cross-sectional view of an EEPROM type memory cell shown in FIG. 1.

The memory cell array 2 includes a plurality of memory cells 21 arranged in a matrix. Each memory cell 21 is an EEPROM-type memory cell and includes a floating gate-type MOS transistor as a non-volatile memory transistor. The memory cell 21 includes a control gate CG and a floating gate FG provided below the control gate CG. Charges are accumulated in the floating gate FG, and data is stored using a change in the threshold voltage value of the transistor which is caused by a change in the amount of the charges accumulated in the floating gate FG. Control gates CG of the memory cells 21 in each row are commonly connected so as to form a word line W. Drains D of the memory cells 21 in each column are commonly connected so as to form a bit line B. Sources S of all the memory cells 21 arranged in a matrix are commonly connected to the ground. Referring to FIG. 2, the term "threshold voltage value Vt" is defined in this specification as a value applied to a control gate CG which is required to provide a current having a prescribed value (e.g., 1 $\mu$A) flowing between the drain D and the source S of one memory cell 21 when a voltage of about 1 V is applied between the drain D and the source S.

Returning to FIG. 1, the row decoder 3X is connected to the word lines N connected to the memory cells 21 as described above, and outputs a prescribed word line selection signal in accordance with a row selection signal value of each of address input signals A0 through An, which are input to an input terminal 31. The column decoder 3Y is connected to the bit lines B connected to the memory cells 21 as described above, and connects one selected bit line B to a data bus in accordance with a column selection signal value of each of the address input signals A0 through An (which are input to an input terminal 31) when data is written to or read from each memory cell 21.

Figure 3:
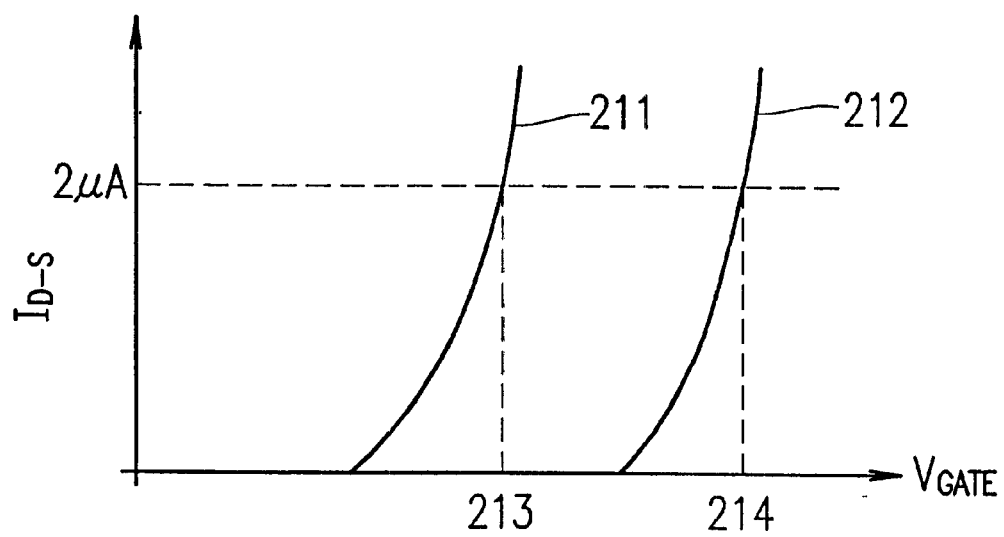
FIG. 3 is a graph illustrating the V-I characteristic of a transistor forming the memory cell shown in FIG. 2.

Before describing the data comparison section 4, a charge escaping defect and a charge increasing defect will be described in detail with reference to FIGS. 3 and 4. In the following explanation, the reference numerals used for the elements of the memory device 1 according to the present invention will be used for easier understanding. For example, in a general NOR-type flash memory, a memory cell 21 exhibits current-voltage characteristics as shown in FIG. 3. In the state where data is erased from the memory cell 21 (an erasing state), no charge is stored in the floating gate FG of the memory cell 21. Thus, the memory cell 21 exhibits a current-voltage characteristic indicated by profile 211 in FIG. 3. In the case where data is written in the memory cell 21 (a writing state), charges are accumulated in the floating gate FG of the memory cell 21, and a bias voltage is applied so as to counteract a positive voltage applied to the control gate CG. Thus, the memory cell 21 exhibits a current-voltage characteristic indicated by profile 212 in FIG. 3. That is, as shown in FIG. 3, the threshold voltage value Vt of the memory cell 21 in the erasing state is at voltage point 213. The threshold voltage value Vt of the memory cell 21 in the writing state is at voltage point 214.

Figure 4:
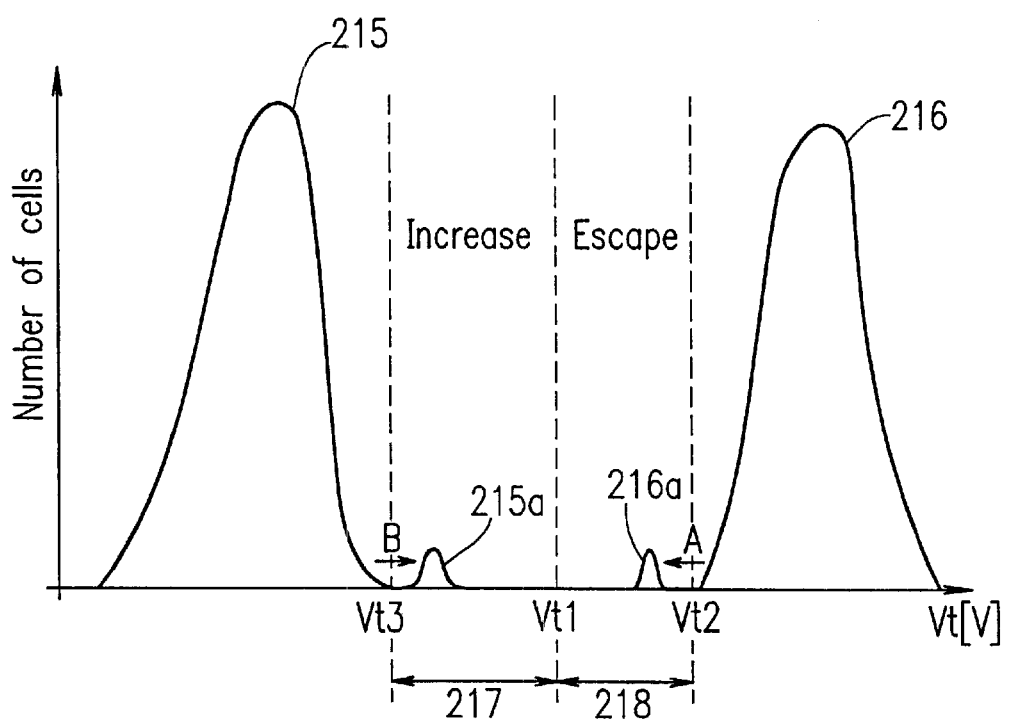
FIG. 4 is a graph illustrating a distribution of a threshold voltage of a memory cell used for describing a gate escaping defect and a gate increasing defect of a memory cell.

FIG. 4 shows a distribution of threshold voltage values Vt in the entire memory cell array 2 including the plurality of memory cells 21. In FIG. 4, about 50% of all the memory cells 21 are in the erasing state (such memory cells 21 will be collectively referred to as an "erasing cell group" and indicted by reference numeral 215), and about 50% of all the memory cells 21 are in the writing state (such memory cells 21 will be collectively referred to as a "writing cell group" and indicted by reference numeral 216). In order to guarantee that the voltage value of the writing cell and the voltage value of the erasing cell are read while being clearly distinguished from each other, the erasing cell group 215 and the writing cell group 216 need to be distributed within a certain range (voltage margin) in each of the positive side and the negative side with respect to a reference threshold voltage value Vt1 for reading. That is, a voltage margin 217 for erasing and a voltage margin 218 for writing are required as shown in FIG. 4. Accordingly, the erasing cell group 215 and the writing cell group 216 are generally distributed, with the voltage margin 217 for erasing and the voltage margin 218 for writing being interposed therebetween.

A charge escaping defect is a phenomenon that the charges accumulated in the floating gate FG of the memory cell 21 in the writing state escape from the memory cell 21 due to, for example, deterioration in the insulating layer. As a result, the threshold voltage value Vt lowers, and a part of the memory cells 21 is offset in terms of distribution in the direction indicated by arrow A in FIG. 4 (a cell group 216a). A charge increasing defect is a phenomenon that the charges are accumulated in the floating gate FG of the memory cell 21 in the erasing state. As a result, a part of the memory cells 21 is offset in terms of distribution in the direction indicated by arrow B in FIG. 4 (a cell group 215a). The memory cells 21 included in the cell group 215a have a charge increasing defect, and the memory cells 21 included in the cell group 216a have a charge escaping defect.

With the above phenomenon as a premise, the data comparison section 4 will be described, again referring to FIG. 1.

The data comparison section 4 includes a reference transistor group (as a reference element group) including reference transistors PT, RT and ET, and a sensing differential amplifier 41 (sensing differential amplification section). The sensing differential amplifier 41 sequentially compares a sense voltage with each of reference voltages to obtain first through third comparison results, and outputs the first through third comparison results to an external device through a data output terminal 42. The sense voltage is obtained based on data which is read from the memory cell 21 selected by the row decoder 3X and the column decoder 3Y in accordance with the input address and then input to a pulled-up sense line SL. The reference voltages are sequentially input to a pulled-up reference line Re via reference transistors PT, RT and ET. A "pulled-up" line refers to a line having a voltage which is raised as a result of connecting the line to a power supply via a resistor.

The reference transistor PT is a reference transistor for writing and is used for determining a threshold voltage reference value for writing (threshold voltage value Vt2). In this example, the reference transistor PT is used for detecting a charge escaping defect of the memory cell 21. The reference transistor RT is a reference transistor for reading and is used for determining a threshold voltage reference value for reading (threshold voltage value Vt1). In this example, the reference transistor RT is used for detecting a charge escaping defect of the memory cell 21 and a charge increasing defect of the memory cell 21. The reference transistor ET is a reference transistor for erasing and is used for determining a threshold voltage reference value for erasing (threshold voltage value Vt3). In this example, the reference transistor ET is used for detecting a charge increasing defect of the memory cell 21.

The device control logic circuit 5 detects whether the memory device 1 is in a super low power consumption mode or in a normal power consumption mode and also performs various controls of the memory device 1 by detecting whether the memory device 1 is in a selection mode or a non-selection mode.

The charge loss compensation control logic circuit 6 includes a data storage defect detection section 67, a data rewriting section 68, and a final address storage section 69. The data storage defect detection section 67 outputs control signals to control gates CG of the reference transistors RT, PT and ET sequentially so as to obtain the first through third comparison results from the sensing differential amplifier 41, and detects a data storage defect of a memory cell 21 based on the first through third comparison results. When a memory cell 21 is detected to have a charge escaping defect, the data rewriting section 68 rewrites data to the memory cell 21 so detected. The final address storage section 69 stores an address of the final memory cell 21 from which a data reading operation was performed for detecting a data storage defect. A signal indicating that the memory device 1 is in the selection mode is sent via a line 66.

The data storage defect detection section 67 operates, for example, in the following manner.

Data read from a memory cell 21 in a normal memory operation is compared with data read from the reference transistor RT for reading. The result is provided as a first comparison result, which is determined as follows. When the threshold voltage value Vt obtained by normal data read of the memory cell 21 is lower than the threshold voltage value of the reference transistor RT (threshold value Vt1), the data storage defect detection section 67 determines that the memory cell 21 is in an erasing state. When the threshold voltage value Vt is higher than the threshold voltage reference value of the reference transistor RT (threshold value Vt1), the data storage defect detection section 67 determines that the memory cell 21 is in a writing state.

The second comparison result is obtained from the data read from the memory cell 21 and the data read from the reference transistor PT for writing. When the first comparison result is the writing state and the second comparison result is not the writing state; i.e., when the threshold voltage value Vt of the memory cell 21 is between the threshold value Vt1 of the reference transistor RT for reading and the threshold value Vt2 of the reference transistor PT for writing, the data storage defect detection section 67 determines that the memory cell 21 has a charge escaping defect. When the first comparison result is the writing state and the second comparison result is also the writing state, the data storage defect detection section 67 determines that the memory cell 21 is in a normal data storage state.

The third comparison result is obtained from the data read from the memory cell 21 and the data read from the reference transistor ET for erasing. When the first comparison result is the erasing state and the third comparison result is not the erasing state; i.e., when the threshold voltage value Vt of the memory cell 21 is between the threshold value Vt1 of the reference transistor RT for reading and the threshold value Vt3 of the reference transistor ET for erasing, the data storage defect detection section 67 determines that the memory cell 21 has a charge increasing defect. When the first comparison result is the erasing state and the third comparison result is also the erasing state, the data storage defect detection section 67 determines that the memory cell 21 is in a normal data storage state of the erasing state.

The data storage defect detection section 67 can detect a data storage defect, for example, during a non-selection period of the memory device 1 (the memory cell 21), a blank period in a selection period, or when the power is turned on. In this specification, the "non-selection period" refers to a period in which the memory device 1 is not selected for, for example, normal data read from, write to, or erase from a memory cell 21. The "selection period" is a period in which the memory device 1 is selected for, for example, normal data read from, write to, or erase from a memory cell 21. A "blank period" refers to a period in the selection period after normal data read from, normal data write to, normal data erase from, or any other memory operation with respect to one memory cell 21 or any other memory operation is finished and before normal data read from, normal data write to, normal data erase from, or any other memory operation with respect to the next memory cell 21 is started. A "normal memory operation", "normal data write" and "normal data read" refer to a normal memory operation of reading data from, writing data to, erasing data from, or performing any other memory operation with respect to a memory cell, which is not performed for a data storage defect.

The data rewriting section 68 can perform a data rewriting operation, for example, when the memory device 1 is switched from the super low power consumption mode to the normal power consumption mode or when the memory device 1 goes into the super low power consumption mode.

The data storage defect detection section 67 starts detection of a data storage defect after normal data read from the memory cells 21 is interrupted and before the normal data read is resumed. The data storage defect detection section 67 starts the detection by reading data with the memory cell 21 at the final address stored in the final address storage section 69.

In the charge loss/gain record memory 7, data storage defect information regarding a charge escaping defect or a charge increasing defect of a memory cell 21 is stored by the charge loss compensation control logic circuit 6 when such a defect is detected. The charge loss/gain record memory 7 and the charge loss compensation control logic circuit 6 form a record information storage section. The data storage defect information includes, for example, an address of the memory cell 21 detected to have a defect, date (year/month/day) and time at which the defect occurred, and the type of the defect (e.g., a charge escaping defect or a charge increasing defect). The data storage defect information is set to be read by a special command from an external device when a product, such as an information apparatus or the like, using the memory device 1 is returned from a customer or the like. The charge loss/gain record memory 7 can be any memory which is non-volatile and allows data to be written only once.

The level monitor section 8 includes a backup capacitor 81 as a backup capacitance section for accommodating charges used for performing a background writing operation and a level monitor section (level monitor circuit) 82 for monitoring whether a terminal voltage of the backup capacitor 81 has lowered to a prescribed voltage value or lower. The level monitor section 82 outputs a supply voltage reduction detection signal to the data rewriting section 68 of the charge loss compensation control logic circuit 6 when the terminal voltage of the backup capacitor 81 has lowered to the prescribed voltage value or lower, and controls the background writing operation to be stopped when the data rewriting section 68 receives the supply voltage reduction detection signal.

The address transfer detection circuit 9 operates as follows. In a blank period, the address transfer detection circuit 9 detects that a background reading operation for detecting a charge escaping defect or a charge increasing defect is completed. When the address transfer is detected by the address transfer detection circuit 9 after the data reading operation period is terminated, the address transfer detection circuit 9 outputs a transfer detection signal to the charge loss compensation control logic circuit 6 so as to control the charge loss compensation control logic circuit 6 to stop the background operation. In this specification, a "background reading operation" refers to a reading operation performed to detect a data storage defect. A "background writing operation" and a "background rewriting operation" refers to an operation of writing data in order to compensate for the charge escape defect".

Figure 5:
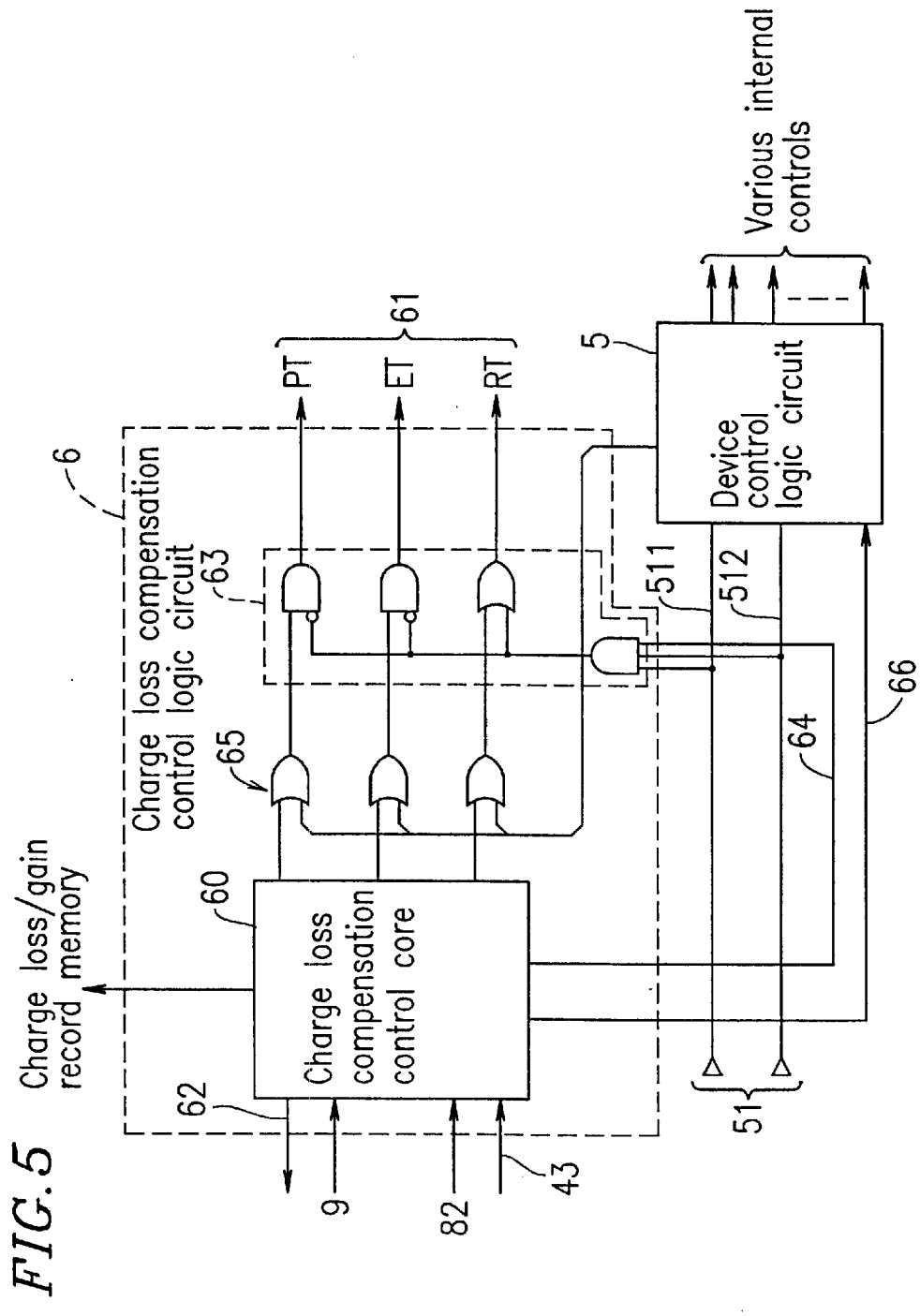
FIG. 5 is a block diagram illustrating one exemplary structure of a charge loss compensation control logic circuit shown in FIG. 1.

FIG. 5 shows one exemplary structure of the charge loss compensation control logic circuit 6 shown in FIG. 1. As shown in FIG. 5, the charge loss compensation control logic circuit 6 includes a charge loss compensation control logic core 60, an OR gate logic circuit 65, and a hot line circuit 63. In other words, the charge loss compensation control logic circuit 6 includes a gate logic circuit including the OR gate logic circuit 65 and the hot line circuit 63. By the gate logic circuit, a background reading operation can be stopped and the normal memory operation can be started immediately when the memory device 1 is switched from the nonselection period to the selection period. A device select signal line 511 for inputting a device select signal from an external device to the memory device 1 and a read enable signal line 512 for inputting a read signal from an external device to the memory device 1 are connected to inputs of the device control logic circuit 5.

An operation of the memory device 1 having the above-described structure will be described, first briefly and then in detail.

Before the memory device 1 is operated, an amount of charges accumulated in each memory element (transistor) is monitored as a background operation. When it is found the charges escape from the floating gate FG of the memory cell 21 for some reason, data is rewritten to the memory cell 21 having the charge escaping defect so as to compensate for the escape of the charges, i.e., the charges are re-injected (this writing operation is referred to also as a "refreshing operation").

Detection of a charge escaping defect does not require any operation from an external device. The charge escaping defect can be detected with high precision and at a high speed by performing a background reading operation while the memory cell 21 is in a wait state or a non-selection state. This data reading operation is performed as follows. Data from each memory cell 21 is compared with data from the reference transistor RT for reading and with data from the reference transistor PT for writing. When a memory cell 21 having a threshold voltage value Vt which is higher than the threshold voltage value Vt1 of the reference transistor RT for reading and is lower than the threshold voltage value Vt2 of the reference transistor PT for writing is detected, this memory cell 21 can be determined to have a charge escaping defect. The reason is that such a threshold voltage value Vt cannot exist. The above-described detection of a charge escaping defect can be performed in, for example, the following periods.

First, the detection of a charge escaping defect of a memory cell 21 can be performed during a non-selection period of the memory device 1. In this case, the non-selection period of the memory device 1 needs to be sufficiently long to perform a background reading operation. Accordingly, in a non-selection period exceeding a prescribed period of time, a reading operation for detecting a charge escaping defect is performed during the non-selection period.

Second, the detection of a charge escaping defect of a memory cell 21 can be performed during a blank period in the selection period of the memory cell 21. Data is read from the memory cell 21, the reference transistor PT for writing and the reference transistor RT for reading. When a memory cell 21 having a threshold voltage value Vt which is higher than the threshold voltage value of the reference transistor RT for reading and is lower than the threshold voltage value of the reference transistor PT for writing is detected, this memory cell 21 can be determined to have a charge escaping defect. The reason is that such a threshold voltage value Vt cannot exist.

When a charge escaping defect of a memory cell 21 is detected as described above, data is written to the same memory cell 21 in the following manner as a refreshing operation. As compared to a data reading operation, a data writing operation requires a greater amount of energy and takes more time. Therefore, it is difficult to perform a background data writing operation.

However, the frequency at which the charge escaping defect occurs is very low, and thus the frequency at which a background data writing operation is required for compensation is also very low. Accordingly, the data can be written in a period in which the memory device 1 is in a non-selection state with certainty and which is sufficiently long for performing a writing operation for compensating for the charge escaping defect of the memory cell 21. A background refreshing operation can be realized by performing a writing operation the moment when the memory device 1 goes into the super low power consumption mode or returns from the super low power consumption mode to the normal power consumption mode. The "moment" here is in the order of microseconds.

After the charge escaping defect is compensated for by the data rewriting operation, a flag indicating that the charge escaping defect is compensated for can be written in the charge loss/gain record memory 7 (EEPROM area) of the memory device 1. In this way, it is possible to obtain some information on the correlation between the charge escaping defect and a defect occurring in actual use, when a product, such as an information apparatus or the like, using the memory device 1 is returned from the customer due to the defect. In addition, the memory device 1 fundamentally should not generate any charge escaping defect. From the charge loss/gain record memory 7 including the flag, it is also possible to obtain the frequency at which the charge escaping defect occurred in actual use. Based on this information, the true data storage characteristic of the memory device 1 can be specified, which leads to accumulation of know-how for realizing a device having still higher reliability.

According to the above-described method of the background writing operation, power for writing data needs to be supplied from a memory system (including the memory device 1). In some types of memory systems, a different level of power is supplied to the memory device 1 during the background writing operation, e.g., during the super low power consumption mode, from during the normal memory operation. More specifically, some types of the memory systems may be in a low power supply mode during the background writing operation. In such a case, additional power cannot be supplied from the memory system. In order to perform a background writing operation to a defective memory cell 21 under such operating circumstances, an electric energy accumulation section (backup capacitance section) can be provided for writing data. Specifically, the backup capacitance section can be the backup capacitor 81 (FIG. 1) for accumulating charges in the memory device 1. During a normal memory operation, charges are accumulated in the backup capacitor 81. When, for example, the memory system goes into the super low power consumption mode and the memory device 1 also goes into the super low power consumption mode, the charges in the backup capacitor 81 are kept accumulated without being discharged. While the memory device 1 is performing detection of a charge escaping defect of a memory cell 21 as a background operation or performing a background writing operation to a memory cell 21 detected to have a charge escaping defect, the electric energy accumulated in the backup capacitor 81 can be used.

So far, the charge escaping defect has been described. A charge increasing defect also occurs that an amount of charges increases in the floating gate of a memory cell 21 of the memory device 1 which is in an erasing state. Since a memory cell 21 cannot usually be selectively erased from a flash EEPROM-type memory device 1, it is impossible to compensate for such a defect. Nevertheless, such a defect can be detected when the threshold voltage value of the memory cell 21 is between the threshold voltage value Vt1 (FIG. 4) of the reference transistor RT for reading and the threshold voltage value Vt3 (FIG. 4) of the reference transistor ET for erasing. The charge increasing defect, as well as the charge escaping defect, is a parameter indicating that the reliability of the memory device 1 is deteriorated. The charge increasing defect cannot be compensated for as described above, but the information on the charge increasing defect can be recorded. When a product, such as an information apparatus or the like, using the memory device 1 is returned from a customer, it is possible to know whether the charge increasing defect occurred or not, which is very useful as a parameter to improve the production process of the memory device 1.

Hereinafter, an operation of the memory device 1 will be described sequentially in detail with reference to FIGS. 1 through 9.

It is assumed that the memory device 1 goes into a super low power consumption mode at the request of the memory system. Usually, the memory device 1 is controlled by the memory system via a control input terminal 51 to go into the super low power consumption mode. At this point, the device control logic circuit 5 puts the memory device 1 into the super low power consumption mode, and also outputs a start signal for starting detection of a charge escaping defect and a charge increasing defect to the charge loss compensation control logic circuit 6 via a line 52. This outputting operation of the start signal also notifies the charge loss compensation control logic circuit 6 that the memory device 1 has been put into the super low power consumption mode. Upon receiving the start signal, the charge loss compensation control logic circuit 6 immediately starts a background reading operation from the memory cell array 2. This operation will be described in more detail with reference to FIG. 6.

Figure 6:
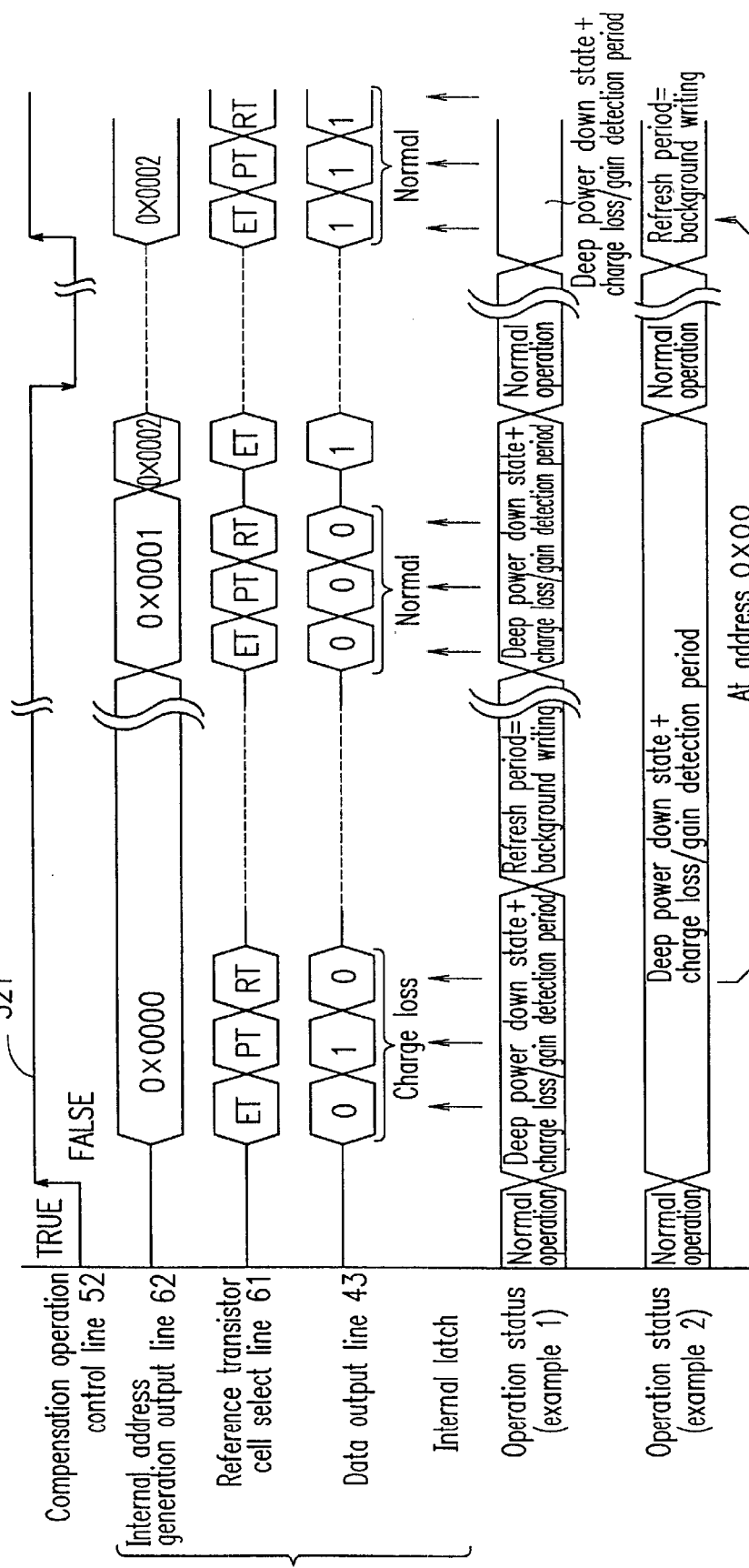
FIG. 6 is a timing diagram illustrating an operation of the EEPROM type memory device shown in FIG. 1.

FIG. 6 is a timing diagram illustrating an operation of the memory device 1 shown in FIG. 1. As shown in FIG. 6, when a start signal 521 is input from the line 52, the charge loss compensation control logic circuit 6 starts detection of a charge escaping defect and a charge increasing defect. More specifically, the charge loss compensation control logic circuit 6 starts generating an internal address upon receiving the start signal 521. The charge loss compensation control logic circuit 6 also sequentially selects the three select lines 61 respectively for connection to the reference transistors PT, RT and ET in order to detect a charge escaping defect and a charge increasing defect.

In more detail, the charge loss compensation control logic circuit 6 outputs the generated internal address to the row decoder 3X and the column decoder 3Y via a line 62, thereby starting a background reading operation from the memory cell array 2. When the background reading operation is started, the charge loss compensation control logic circuit 6 sequentially selects the reference transistors PT, ET and RT via the select lines 61. The order of selection is not important, but herein the reference transistor ET for erasing, the reference transistor PT for writing and the reference transistor RT for reading are selected in this order. Regarding data output from the sensing differential amplifier 41, a value "1" indicates erasing and a value "0" indicates writing.

In FIG. 6, the charge loss compensation control logic circuit 6 obtains a value "0" read using the reference transistor ET for erasing, a value "1" read using the reference transistor PT for writing, and a value "0" read using the reference transistor RT for reading, when the internal address is generated and the reference transistors ET, PT and RT are sequentially selected. It is appreciated that the memory cell 21 shown in FIG. 6 has a charge escaping defect. When the memory cell 21 is in the normal data storage state, the data from a data output line 43 has a value "0" read using the reference transistor ET for erasing, a value "0" read using the reference transistor PT for writing, and a value "0" read using the reference transistor RT for reading.

When no charge escaping defect or charge increasing defect is found, the charge loss compensation control logic circuit 6 performs an automatic increment so as to generate the next internal address. Thus, all the memory cells 21 in the memory cell array 2 are sequentially scanned so as to confirm whether the data storage state thereof is normal or defective.

When a charge escaping defect is found, the charge loss compensation control logic circuit 6 can either go into a background rewriting operation, or therein store the address of the memory cell 21 having the defect therein so that a background writing operation can be performed at an appropriate time. Usually, the writing operation requires power for injecting charges to the floating gate FG of the memory cell 21. In, for example, a memory system of a cellular phone or the like, the load of supplying the power may be excessive. When the entire memory system goes into the super low power consumption mode, a necessary level of power may not be supplied to the memory device 1. In order to deal with such a situation, the power can be supplied in the following three methods.

According to a first power supply method (operation status example 1 in FIG. 6), the memory device 1 has a built-in backup capacitance section including the backup capacitor 81. A background writing operation is performed using the power from the backup capacitor 81. As the background writing operation is continued, however, the terminal voltage of the backup capacitor 81 decreases. The level of the terminal voltage is monitored by the level monitor section (level monitor circuit) 82. When the terminal voltage of the capacitor 81 becomes a prescribed value or less, the level monitor section 82 outputs a signal indicating the level reduction to the charge loss compensation control logic circuit 6 via a line 83. Thus, the charge loss compensation control logic circuit 6 is informed of the reduction in the terminal voltage of the backup capacitor 81. Then, the level monitor section 82 controls the charge loss compensation control logic circuit 6 to stop the background writing operation.

According to a second power supply method (operation status example 2 in FIG. 6), a background writing operation is performed during a period in which the background writing operation is possible, e.g., the moment when the memory device 1 returns to the normal power consumption mode from the super low power consumption mode, using the final address in the charge loss compensation control logic circuit 6. When the memory device 1 returns from the super low power consumption mode to the normal power consumption mode, the memory device 1 usually needs to be provided with a delay time period for stable return. During the delay time period, the background writing operation can be performed with no load of supplying power applied on the memory system (including the memory device 1) in terms of power since the power supply of the memory system has a normal power supply capability in this period.

According to a third power supply method, the address of the memory cell 21 having the data storage defect is stored in the charge loss compensation control logic circuit 6 as described above. Unlike the operation status example 2 in FIG. 6, the background writing operation is performed when the memory device 1 goes into the super low power consumption mode. Generally, for stable operation of the memory system, the power supply capability of the memory system is not reduced the moment when the memory system goes into the super low power consumption mode but after a certain delay time period. Using this delay time period, the background writing operation can be performed.

After the background writing operation is performed in any of the above-described methods, a record regarding the memory cell 21 can be kept as follows. When at least one of a charge escaping defect and a charge increasing defect is found, the charge loss compensation control logic circuit 6 stores, in the charge loss/gain record memory 7, data storage defect information, for example, an address of the memory cell 21 having the data storage defect and type of the charge storage defect (e.g., a charge escaping defect and/or a charge increasing defect). The data storage defect information can be read by an external device using a special command when a product, such as an information apparatus or the like, using the memory device 1 is returned from a customer.

In the case where the memory cell 21 has a charge increasing defect, the data from the data output line 43 has a value "0" read using the reference transistor ET for erasing, a value "1" read using the reference transistor PT for writing, and a value "1" read using the reference transistor RT for reading. The charge increasing defect cannot be compensated for by rewriting data, unlike the charge escaping defect. The reason is that since the flash EEPROM type memory device 1 allows data in a memory block to be erased only in a batch manner, charges cannot be forcibly removed from an arbitrary memory cell 21. However, the information on the occurrence of the charge increasing defect which is stored in the charge loss/gain record memory 7 can be used later in the above-described manner.

When the memory device 1 goes into a deep power down mode after once returning from the super low power consumption mode to the normal power consumption mode, without the power supply to the memory device 1 being interrupted, the operation can be started with the final memory cell 21 from which the previous background data reading operation was performed. Alternatively, the operation can be started with a memory cell 21 immediately after the final memory cell 21. In order to realize this, a work RAM area is provided in the charge loss compensation control logic circuit 6 and the final address is stored in the work RAM area. The content of the storage is not erased unless the power supply of the memory device 1 is turned off. When the memory device 1 goes into the super low power consumption mode again, the content stored in the work RAM area (i.e., the final address) is read, and the reading operation for detecting a charge escaping defect and a charge increasing defect can be started with the final memory cell 21 at the final address.

Instead of using the work RAM, an EEPROM type memory cell can be used. In this case, it is possible to store the final address even after the power supply of the memory device 1 is turned off. Thus, a reading operation for detecting a charge escaping defect and a charge increasing defect can be started with the final memory cell 21 at the final address, regardless of whether the power supply of the memory device 1 is on or off.

In addition to operation during the super low power supply mode, the background writing operation can be performed in a non-selection period of the memory device 1. When the non-selection period of the memory device 1 exceeds a prescribed time period, the memory system (including the memory device 1) goes into a mode which does not require the memory device 1 and thus determines that a background writing operation can be performed with no problem. Thus, the memory system enables the background writing operation.

During this period, a charge escaping defect and a charge increasing defect can be detected in addition to performing the background writing operation. When the memory device 1 goes into a selection state while performing a detection operation for a charge escaping defect or a charge increasing defect or performing a background writing operation, the memory device 1 needs to immediately return to the normal memory operation mode. In order to realize this, when the device control logic circuit 5 detects that the memory device 1 is in a selection state, the device control logic circuit 5 immediately outputs a signal, indicating that the memory device 1 is detected to be in the selection state, to the charge loss compensation control logic circuit 6.

In the case where the internal circuit configuration of the charge loss compensation control logic circuit 6 is as shown in FIG. 5, the memory device 1 can return to the normal memory operation immediately. When the memory device 1 returns to a command input mode, which can be handled only by the device control logic circuit 5, the background operation can be stopped by the charge loss compensation control logic circuit 6 while the command input is handled by the device control logic circuit 5.

This operation will be described in detail with reference to FIG. 7. It is assumed that in period D in FIG. 7, the memory device 1 performs a background writing operation for compensating for a charge escaping defect of a memory cell 21. At this point, a device select signal and a read signal are asserted to be enabled. Thus, the memory device 1 should immediately stop the background operation and perform normal data read. This is realized by the gate logic circuit including the OR gate logic circuit 65 and the hot line circuit 63. When the device select signal becomes enabled and the read signal becomes enabled, a background enable line 64 (FIG. 5) should be immediately disabled. However, the background enable line 64 is formed of a complicated logic circuit and thus it is substantially impossible to instantaneously disable the background enable line 64 without influencing the operation of the memory device 1. Accordingly, in period E in FIG. 7, the background enable line 64 is kept enabled for a certain time period even after the non-selection period is over. A direct read signal is generated from the select signal and the read enable signal of the memory device 1, and the direct read signal is directly input to the reference transistor RT for reading. The hot line circuit 63 allows the memory device 1 to immediately return to the normal memory operation. In period F, when the charge loss compensation control logic core 60 as a background control circuit is completely stabilized, the signal from the background enable line 64 goes into a disable state, and the select lines 61 for the reference transistors PT, ET and RT are now controlled by a control circuit for performing normal device control.

In the above-described operation, the memory device 1 can be instantaneously transferred from a background operation to the normal memory operation. When the memory device 1 returns to normal data read, the hot line circuit 63 as described above needs to be additionally provided. When the memory device 1 returns to any other type of normal memory operation, the hot line circuit 63 is not specifically required. The reason is that the other types of normal memory operation other than the data read, e.g., data write, data erase and status read, are all executed by the memory system using a command. The command is independently received by a device controller for performing normal device control, which is separate from the charge loss compensation control logic circuit 6. The device controller analyzes the command and performs the next operation (erase, write, or the like). This operation requires a certain time period. Therefore, any special hot line circuit 63 for instantaneously switching the operation of the reference transistors to the normal memory operation mode is not specifically required.

Figure 7:
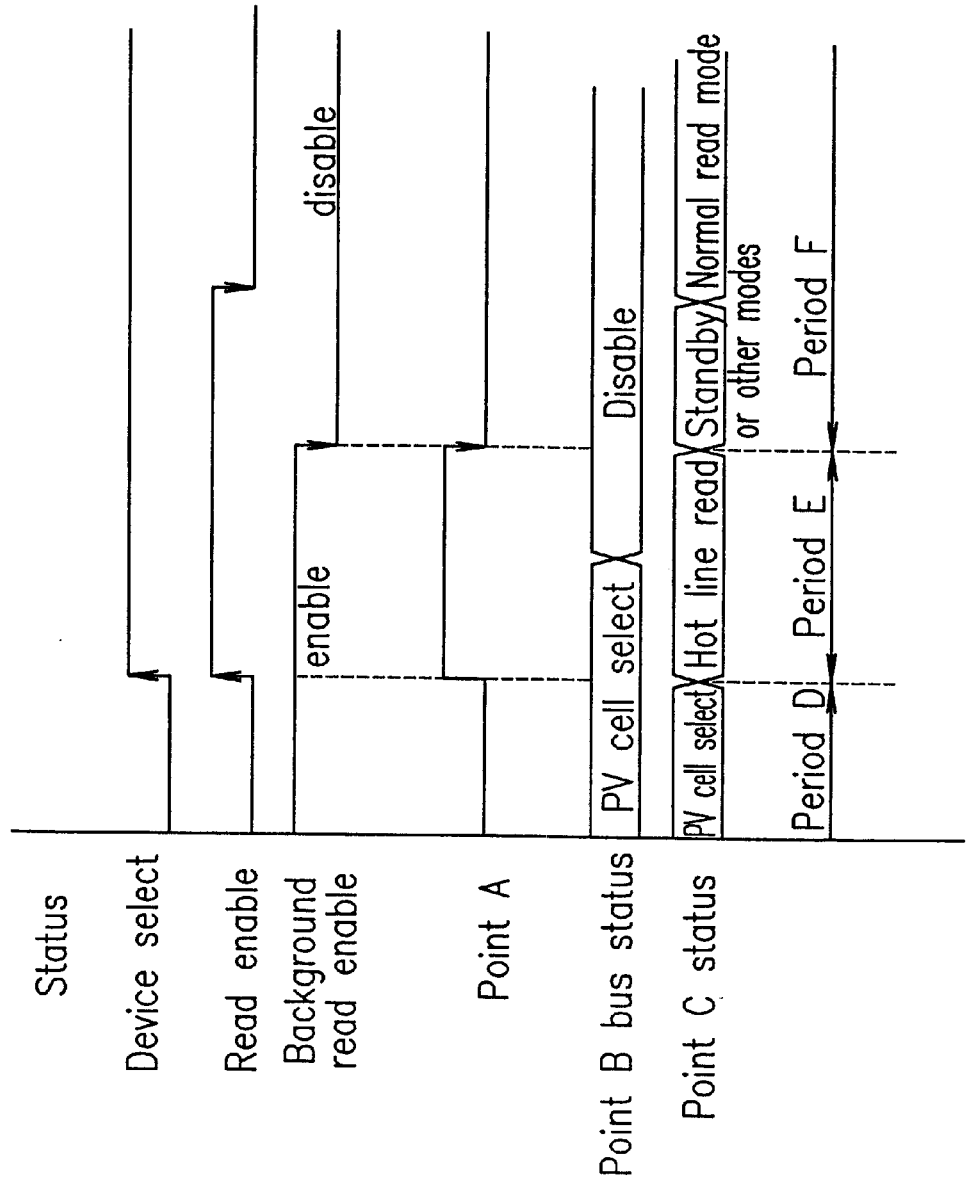
FIG. 7 is a timing diagram illustrating an operation of a hot line circuit shown in FIG. 5 for immediately returning the memory device to normal data read.

In FIG. 7, "PV" refers to program verify.

In the case where the memory device 1 has a very long data read period (e.g., the order of several tens of microseconds), while the memory device 21 is not substantially operating after the normal data read is completed, data in each memory cell 21 is read as compared with the reference transistor RT for reading, as compared with the reference transistor PT for writing, and as compared with the reference transistor ET for erasing. This operation will be described with the timing diagram in FIG. 8.

Figure 8:
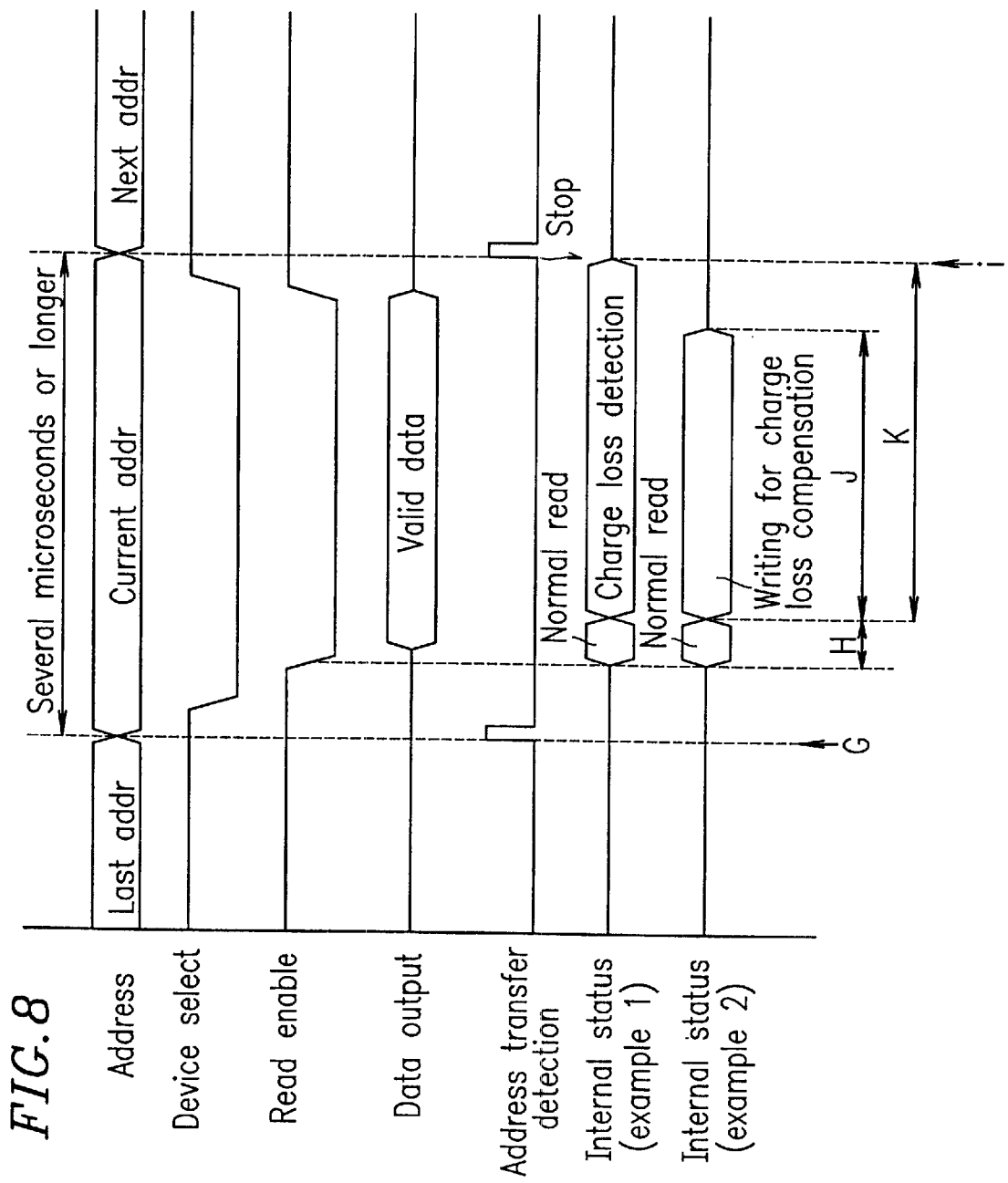
FIG. 8 is a timing diagram illustrating an operation of the EEPROM type memory device shown in FIG. 1 for performing a background reading operation and a background writing operation during a long operation cycle time.

As shown in FIG. 8, the addresses are transferred at point G. After that, the device select line 511 and the read enable line 512 become enabled. In period H in FIG. 8, data read is performed inside the memory device 1. The cycle time of data read is several tens of microseconds, whereas a period required for the data read is several hundred nanoseconds. Accordingly, the data read is finished in the memory device 1 in a shorter time period than the cycle time as shown in period H of FIG. 8. In a blank period after the data read is finished, a background reading operation for detecting a charge escaping defect or a charge increasing defect of a memory cell 21 is performed. The address transfer detection circuit 9 detects that the data reading operation period (data read period) is terminated. When the address transfer is detected by the address transfer detection circuit 9 after the data reading operation period, the background operation is stopped (point i in FIG. 8).

During idling period K after the normal data read is completed, a background writing operation for compensating for the charge escaping defect is performed (period J in FIG. 8). The writing operation is preferably completed in the same data read period, unlike the reading operation. Accordingly, an algorithm which prohibits the background writing operation when the period required for background writing operation is longer than idling period K needs to be adopted.

As described above, according to the present invention, the charge loss compensation control logic circuit 6 determines that the memory cell 21 has a charge escaping defect when the threshold voltage value of the memory cell 21 is between the threshold voltage value of the reference transistor RT for reading and the threshold voltage value of the reference transistor PT for writing. The charge loss compensation control logic circuit 6 also determines that the memory cell 21 has a charge increasing defect when the threshold voltage value of the memory cell 21 is between the threshold voltage value of the reference transistor RT for reading and the threshold voltage value of the reference transistor ET for erasing. Therefore, the charge escaping defect can be clearly distinguished from the charge increasing defect. Thus, highly precise detection of a data storage state, for example, whether the memory cell 21 has a charge escaping defect or a charge increasing defect, can be performed.

When the memory device 1 has a non-selection period which is sufficiently long to perform a background writing operation to the memory device 1 (for example, when the cycle time is relatively long when the memory device 1 is in a non-selection period), a rewriting operation can be performed to the memory cell 21 having the charge escaping defect. In this way, a difficult-to-obtain time period for the background rewriting operation can be obtained. When the memory device 1 has an operation cycle time which is sufficiently long to perform a background writing operation to the memory device 1 and while the normal data read is performed by the memory device 1, a rewriting operation can be performed to the memory cell 21 having the charge escaping defect. In this way a difficult-to-obtain time period for the background rewriting operation can be obtained. In the case where the memory system is performing normal data read and the cycle time for operating the memory device 1 is sufficiently long, a background reading operation for detecting a charge escaping defect and a charge increasing defect can be performed after the normal data read from the memory device 1 is finished. In this way, the background reading operation can be efficiently performed.

As described above, according to the present invention, a data storage defect is detected based on a comparison result between the data read from a memory cell and data read from each of a reference element for reading, a reference element for writing and a reference element for erasing. Therefore, a charge escaping defect and a charge increasing defect can be clearly distinguished from each other. Thus, highly reliable data storage can be realized without entirely requiring a vast amount of know-how to be accumulated.

According to the present invention, a data comparison section can be easily and satisfactorily formed using a reference element group and a sensing differential amplification section.

According to the present invention, a memory cell having an abnormal or defective data storage characteristic is detected using a reference element for reading and a reference element for writing. Therefore, a charge escaping defect can be detected with high precision.

According to the present invention, a memory cell having an abnormal or defective data storage characteristic is detected using a reference element for reading and a reference element for erasing. Therefore, a charge increasing defect can be detected with high precision.

According to the present invention, whether the data storage is normally performed or not can be checked when the memory device is turned on. Usually when the memory device is turned on, the memory system is provided with a delay period for stable start. This delay time period can be used to perform a background data rewriting operation. Thus, a difficult-to-obtain time period for the background rewriting operation can be obtained with certainty. A data storage defect can also be detected during a non-selection period of the memory device and a blank period while normal data read is performed from the memory cell.

According to the present invention, when a memory cell has a charge escaping defect, the data can be rewritten to the memory cell to compensate for the defect.

When the memory system returns from a super low power consumption mode to a normal power consumption mode, the memory system is usually provided with a delay period for stable return. According to the present invention, this delay period is used to perform a background data rewriting operation. Thus, a difficult-to-obtain time period for the background rewriting operation can be obtained with certainty.

When the memory system goes into the super low power consumption mode, the memory system is usually provided with a delay period for stable return. According to the present invention, this delay period is used to perform a background data rewriting operation. Thus, a difficult-to-obtain time period for the background rewriting operation can be obtained with certainty.

According to the present invention, the memory device has a built-in backup capacitance section such as a capacitor for obtaining energy required to perform a background operation in the super low power consumption mode.

Therefore, the stable background operation is obtained, and the time period in which the stable background can be performed can be extended.

According to the present invention, when the supply voltage lowers to a prescribed value or lower, the data rewriting operation is stopped. Thus, the data rewriting operation can be performed more stably.

According to the present invention, information regarding a memory having a charge escaping defect or a charge increasing defect is stored as record information. A record information storage section can be formed using a dedicated memory which allows data to be written only once. By removing the information from the record information storage section later, information (e.g., parameters) which is important for development of a device having still higher reliability can be obtained.

According to the present invention, when a background reading operation for detecting a charge escaping defect or a charge increasing defect is interrupted, address information of the final memory cell which was scanned is stored in, for example, a work RAM area. When the background operation is allowed to be performed again, the address of the memory cell at which the background operation is to be started is determined based on the information. Thus, an efficient background reading operation can be performed. When power is turned off while a background reading operation for detecting a charge escaping defect or a charge increasing defect is performed, address scanning information is stored in, for example, an EEPROM area. When the power is turned on again and the background reading operation is resumed, the address scanning information up to the previous background reading operation can be read from the EEPROM area and the reading operation is started with the address at which the previous background reading operation was terminated. Thus, an efficient background reading operation can be performed.

Figure 9:
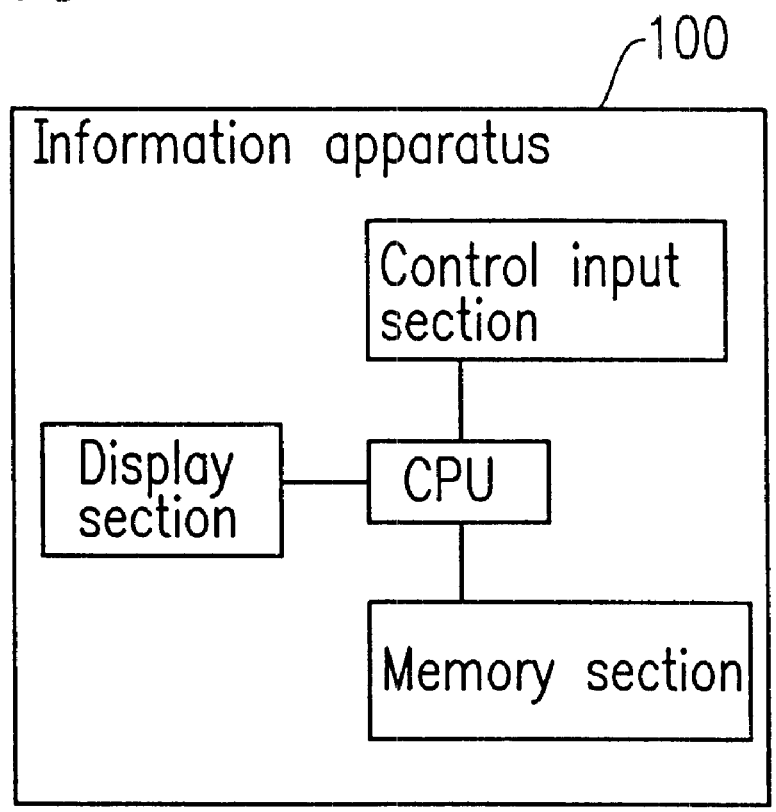
FIG. 9 is a block diagram illustrating a basic structure of an information apparatus incorporating a non-volatile semiconductor memory device according to the present invention.

In the above example, a non-volatile semiconductor memory device is described. A non-volatile semiconductor memory device according to the present invention can be easily incorporated into an information apparatus such as, for example, a cellular phone or a computer so as to provide the effect of the present invention. For example, as shown in FIG. 9, an information apparatus 100 can include an information memory section such as, for example, a RAM or a ROM (e.g., a flash memory), a control input section, a display section for displaying an initial screen or an information processing result, such as, for example, a liquid crystal display device, and a CPU (central processing unit). The CPU performs various types of information processing by reading information from or writing information to the information memory section (memory operation) or transferring data, upon receiving a control instruction from the control input section, based on a prescribed information processing program or data thereof. In this case, the non-volatile semiconductor memory device according to the present invention can be easily used in the information memory section.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A non-volatile semiconductor memory device for allowing a data writing operation to, a data reading operation from, and a data erasing operation from a plurality of non-volatile memory cells, the non-volatile semiconductor memory device comprising:

a data comparison section for outputting a first comparison result obtained by comparing data read from each of the plurality of memory cells and data read using a reference element for reading, a second comparison result obtained by comparing data read from each of the plurality of memory cells and data read from a reference element for writing, and a third comparison result obtained by comparing data read from each of the plurality of memory cells and data read from a reference element for erasing; and a data storage defect detection section for detecting a data storage defect of a memory cell among the plurality of memory cell, based on the first, second and third comparison results obtained from the data comparison section.

2. A non-volatile semiconductor memory device according to claim 1, wherein the data comparison section includes:

a reference element group including the reference element for reading, the reference element for writing, and the reference element for erasing; and a sensing differential amplification section connected to each of the plurality of memory cells, which are of an EEPROM type, at one input end of the section and also connected to the reference element group at the other input end of the section.

3. A non-volatile semiconductor memory device according to claim 1, wherein when a threshold voltage value of a memory cell among the plurality of memory cells is between a threshold voltage value of the reference element for reading and a threshold voltage value of the reference element for writing, the data storage defect detection section determines that the memory cell has a charge escaping defect.

4. A non-volatile semiconductor memory device according to claim 1, wherein when a threshold voltage value of a memory cell among the plurality of memory cells is between a threshold voltage value of the reference element for reading and a threshold voltage value of the reference element for erasing, the data storage defect detection section determines that the memory cell has a charge increasing defect.

5. A non-volatile semiconductor memory device according to claim 1, wherein the data storage detection section detects the data storage defect at least one of: during a non-selection period of each memory cell, during a blank period while normal data read is performed from each memory cell, and when power is turned on.

6. A non-volatile semiconductor memory device according to claim 2, wherein when a threshold voltage value of a memory cell among the plurality of memory cells is between a threshold voltage value of the reference element for reading and a threshold voltage value of the reference element for writing, the data storage defect detection section determines that the memory cell has a charge escaping defect.

7. A non-volatile semiconductor memory device according to claim 2, wherein when a threshold voltage value of a memory cell among the plurality of memory cells is between a threshold voltage value of the reference element for reading and a threshold voltage value of the reference element for erasing, the data storage defect detection section determines that the memory cell has a charge increasing defect.

8. A non-volatile semiconductor memory device according to claim 6, wherein when a threshold voltage value of a memory cell among the plurality of memory cells is between a threshold voltage value of the reference element for reading and a threshold voltage value of the reference element for erasing, the data storage defect detection section determines that the memory cell has a charge increasing defect.

9. A non-volatile semiconductor memory device according to claim 8, further comprising a record information storage section for storing, as record information, memory cell information corresponding to the charge escaping defect and memory cell information corresponding to the charge increasing defect.

10. A non-volatile semiconductor memory device according to claim 3, wherein when a threshold voltage value of a memory cell among the plurality of memory cells is between a threshold voltage value of the reference element for reading and a threshold voltage value of the reference element for erasing, the data storage defect detection section determines that the memory cell has a charge increasing defect.

11. A non-volatile semiconductor memory device according to claim 10, further comprising a record information storage section for storing, as record information, memory cell information corresponding to the charge escaping defect and memory cell information corresponding to the charge increasing defect.

12. A non-volatile semiconductor memory device according to claim 3, further comprising a data rewriting section for, when a memory cell among the plurality of memory cells has the charge escaping defect, performing a data rewriting operation to the memory cell.

13. A non-volatile semiconductor memory device according to claim 12, wherein the data rewriting section performs the data rewriting operation when the memory cell returns from a super low power consumption mode to a normal power consumption mode.

14. A non-volatile semiconductor memory device according to claim 12, wherein the data rewriting section performs the data rewriting operation when the memory device goes into the super low power consumption mode.

15. A non-volatile semiconductor memory device according to claim 14, wherein the data rewriting section performs the data rewriting operation by supplying power from a backup capacitance section when the memory device goes into the super low power consumption mode.

16. A non-volatile semiconductor memory device according to claim 15, further comprising a supply voltage monitor section for outputting a writing stop signal for stopping the data rewriting operation when the power supplied from the backup capacitance section becomes a prescribed level or lower.

17. A non-volatile semiconductor memory device according to claim 1, further comprising a final address storage section for storing a final address of a final memory cell, among the plurality of memory cells, from which the data reading operation was performed for detecting the data storage defect, wherein the data storage defect detection section uses the address stored in the final address storage section to resume detection of the data storage defect by performing the data reading operation using the final address.

18. An information apparatus using the non-volatile semiconductor memory device according to claim 1 for detecting a data storage defect of a memory cell.

* * * * *